United States Patent [19]

Nishizawa et al.

[11] Patent Number: 4,745,374
[45] Date of Patent: May 17, 1988

[54] EXTREMELY-HIGH FREQUENCY SEMICONDUCTOR OSCILLATOR USING TRANSIT TIME NEGATIVE RESISTANCE DIODE

[75] Inventors: Jun-ichi Nishizawa; Kaoru Motoya, both of Sendai, Japan

[73] Assignee: Zaidan Hojin Handotai Kenkyu Shinkokai, Sendai, Japan

[21] Appl. No.: 875,095

[22] Filed: Jun. 17, 1986

[30] Foreign Application Priority Data

Jun. 18, 1985 [JP] Japan .................. 60-132723

[51] Int. Cl.⁴ ............................. H03B 7/14
[52] U.S. Cl. ......................... 331/96; 331/107 R; 331/107 DP; 331/107 T
[58] Field of Search ........... 331/96, 104, 107 R, 331/107 DP, 107 T, 107 SL, 107 L; 357/13, 57

[56] References Cited

U.S. PATENT DOCUMENTS 3,602,840  8/1971  Nishizawa .................. 331/107 T X

FOREIGN PATENT DOCUMENTS 56-112561  9/1981  Japan .

OTHER PUBLICATIONS

Infrared and Millimeter Waves, vol. 5, Chapter 4, "The GaAs Tunnett Diodes"–Jun–ichi Nishizawa, 1982.
"Impatt Devices for Generation of Millimeter Waves, chapter 2, 1979–H. J. Kuno.

Primary Examiner—Eugene R. Laroche
Assistant Examiner—David Mis
Attorney, Agent, or Firm—Cushman, Darby & Cushman

[57] ABSTRACT

An extremely-high frequency semiconductor oscillator which produces a large but substantially noise-free output power with minimized fluctuation of output power for changes in device temperature is realized by using, as its power producing component, a semiconductor transit time diode having a frequency-dependent negative resistance mounted in a cavity resonator of a wave guide means provided with a tuning short at one side of the waveguide means and being designed to perform carrier injection by a combination of tunnel and avalanche phenomena.

6 Claims, 5 Drawing Sheets

EXTREMELY-HIGH FREQUENCY SEMICONDUCTOR OSCILLATOR USING TRANSIT TIME NEGATIVE RESISTANCE DIODE

BACKGROUND OF THE INVENTION (a) Field of the Invention:

The present invention concerns a semiconductor oscillator operated at an extremely-high frequency which is even higher than "super-high", and more particularly it pertains to an oscillator operated at an extremely-high frequency using a seminconductor transit time device having a frequency-dependent negative resistance.

(b) Description of the Prior Art:

Attention of those concerned is being given to an oscillator using—as its semiconductor power producing unit—constituting member for producing oscillation in an extremely high frequency region in terms of microwave, millimeter wave or submillimeter wave—a Gunn diode or an IMPATT (IMPact-ionization Avalanche Transit Time) device, or a TUNNETT (TUNNEl injection Transit Time) diode. Of these known types of diodes, the Gunn diode is a semiconductor device having no pn junction, and this device was noted for the first time by Gunn of IBM to produce current oscillation when operated in the microwave frequency region. Its operation mechanism is such that, when a high voltage is applied across the opposite terminals of a bulk semiconductor plate to elevate its internal electric field intensity E to a value above a certain level, i.e. above a critical (threshold) value, the diode plunges into an electrically unstable state which is called the Gunn effect wherein the change of the average drift velocity $\bar{v}$ of carries relative to the field intensity E, i.e. differential mobility $d\bar{V}/dE$, becomes negative, and the device develops current oscillation.

A solid-state microwave power producing unit using this Gunn diode which serves as an important component of this power producing unit has attracted quite a bit of attention for some time since its "debut". However, this Gunn diode has the drawback that, as the temperature of the device rises during its operation, the drift velocity as well as the mobility of those electrons which are carriers will drop substantially, so that the microwave output power progressively drops with the rise in the device temperature, and that, further, the oscillation frequency threshold peculiar to this diode is low, being only about 100~130 GHz at most which is much lower as compared to that of the TUNNETT diode and that of the IMPATT diode, in which oscillation frequencies are both in the level of the submillimeter wave region.

The IMPATT diode and the TUNNETT diode, on the other hand, are called transit time negative resistance devices, in which oscillation frequencies are much higher than that of the Gunn diode, and they have attracted the attention as being the devices having the capability of outputting a high oscillation power even in such a high frequency region as the submillimeter wave region.

Of these two types of diodes, the IMPATT diode is a device having a pn junction which is designed to be operative sothat an avalanche breakdown is caused by a reverse voltage applied across this pn junction, and that this avalanche breakdown, in turn, causes an injection, across the pn junction, of those carriers produced in either contiguous region, and that by virtue of this avalanche breakdown and also of the transit time effect of the carriers thus produced, a frequency-dependent negative resistance caused by a phase delay between the current and the voltage applied leads to the development of an oscillation and an amplification at a high frequency.

While the IMPATT diode features a relatively high output power at a high operating frequency on the one hand, it has the drawback that carriers (electrons and positive holes) are produced as a result of the avalanche breakdown, and these carriers will drift through the bulk, causing the tendency that the device is broken easily. Another important drawback is that the drifting carriers cause very large noises.

Especially in the IMPATT diode, there is the inconvenience that a rise in the temperature of the device brings about a difficulty in causing an injection of carriers by relying on the avalanche breakdown. Hence the drawback that the output power thereof as the oscillator component drops in the frequency region around 100 GHz or thereabove. This is reported also in, for example, Chapter 2, "IMPATT Devices for Generation of Millimeter Waves" by H. J. KUNO, and in "Infrared & Millimeter Waves", Vol. 1, Academic Press, 1979, edited by K. J. Button. It is stated there to the effect that the frequency of oscillation and the power output of an IMPATT diode are strongly dependent upon the junction temperature, and that the typical temperature (T) coefficient of an Si IMPATT diode for frequency drift in the millimeter wave region is $-5 \times 10^{-5}/°C$. and that its temperature coefficient for power output (P) variation, i.e. for the power drop rate dP/dT, is $-0.005$ dB/°C. Thus, the temperature coefficient for power output in an IMPATT diode is usually negative.

It has been said that usually in a Si IMPATT diode, the junction temperature must be kept at a level lower than about 200° C. in order to preserve the electrical characteristics of the device and also to prevent the thermal burnout. In practice, however, since an input power is applied to the diode to cause its oscillation, the junction temperature will naturally rise. Also, even where a heat-sink such as a copper plate is provided on the device to obtain a practical frequency or output power, it is the present state of art to operate the device at a temperature level around the upper limit of the above-mentioned temperature range. As one of the techniques intended to avoid the excessive rise of the temperature, T. ISHIBASHI et al. have reported the technique to effect cooling, by liquid $N_2$, the IMPATT diode designed to be operated at a high frequency ranging especially from the millimeter wave region to the submillimeter wave range (T. ISHIBASHI, M. INO, T. MAKIMURA and M. OHMORI, "LIQUID NITROGEN-COOLED SUBMILLIMETER-WAVE SILICON IMPATT DIODE", Electronics Letters, 12th May, 1977, vol. 13, No. 10 pp. 299~230). This technique, however, has the drawback that the entire device as a solid-state oscillator assumes a large size.

In contrast thereto, the TUNNETT diode is designed to develop a tunnel breakdown in place of the avalanche breakdown which takes place in case of the IMPATT diode, and by virtue of the frequency-dependent negative resistance similar to that noted in the IMPATT diode which, in case of the TUNNETT diode, is brought about by both of said tunnel breakdown and the transit time effect of the carriers produced thereby, there are performed an oscillation and an amplification at a high frequency.

The TUNNETT diode features the injection of carriers from one region having a certain conductivity type into its adjacent region having an opposite conductivity type by virtue of said tunnel breakdown, i.e. the so-called tunnel effect, so that it has the advantage that there arises very little noise.

As will be noted from the foregoing statement, the Si IMPATT diode which has hitherto attracted the attention of those concerned as being a semiconductor junction device which develops oscillation with a relatively high level of output power at the conventionally used highest frequency region has the drawbacks that it develops a large noise during its operation and that, in the frequency region of about 100 GHz or higher, there arises a drift (fluctuation) of an oscillation frequency and also a reduction of the output power due to the rise in the junction temperature, and further it involves the problems that, in case a cooling means using, for example, liquid $N_2$ is provided, the device as a whole becomes larger in size.

Apart from the above-mentioned semiconductor devices, a vacuum tube, e.g. a backward wave tube (tradename: Carcinotron) provides a large output in the frequency range from millimeter wave region to submillimeter wave region. However, it has the following important drawbacks: that its life time is very short, being about 300 hours, which is very much shorter than that of such a semiconductor device as the IMPATT diode; that it requires an operating voltage as high as 1000 V or greater, thus requiring a very large operating power supply and also a plurality of power supply circuit systems for operating the tube; and that its overall weight as a system is large and also the system is expensive.

SUMMARY OF THE INVENTION

It is, therefore, a primary object of the present invention to provide an extremely-high frequency oscillator which uses a semiconductor junction device, i.e. a semiconductor transit time negative resistance device, and which performs an oscillation or an amplification in an extremely high frequency region by virtue of transit time negative resistance, and which is free of the above-mentioned drawbacks, i.e. in which output power will hardly drop but would be augmented even at an elevated device temperature.

More particularly, it is the object of the present invention to provide an extremely-high frequency oscillator of the type mentioned above, which uses a semiconductor transit time negative resistance device such that the carrier injection into the transit region is not performed merely by virtue of the avalanche breakdown phenomenon alone as in case of the IMPATT diode, nor by virtue of merely the tunnel breakdown phenomenon alone as in the TUNNETT diode, but is, in fact, performed under a specific condition represented by a mixture or combination of the avalanche breakdown phenomenon and the tunnel breakdown phenomenon, whereby the dependency of the output power P of the oscillator upon the device temperature T (i.e. the temperature coefficient for the output power variation) is either zero or positive, i.e. $dP/dT \geq 0$.

DETAILED DESCRIPTION OF THE PREFERRED EMBODIMENTS

The present invention will hereunder be described in further detail with respect to an embodiment illustrated.

Figure 1:
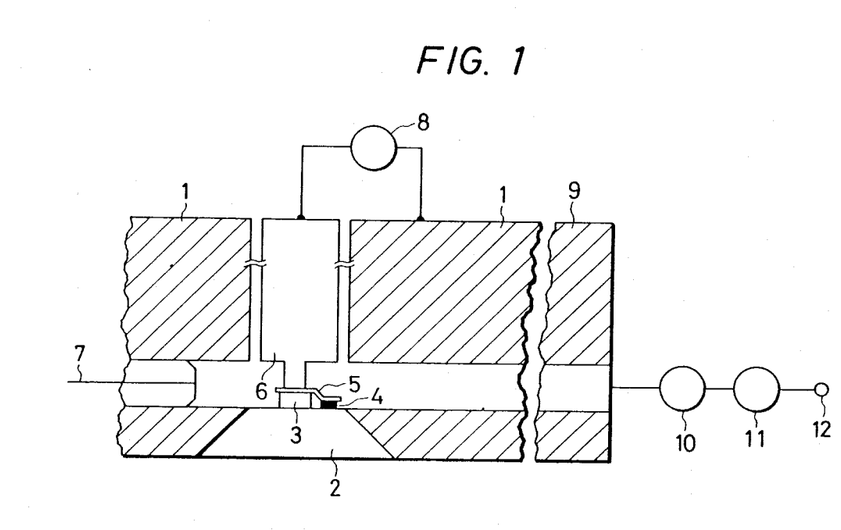
FIG. 1 is an embodiment of the circuit system of an extremely-high frequency oscillator using a semiconductor transit time negative resistance device according to the present invention.

FIG. 1 shows a circuit system of an extremely-high frequency oscillator using a semiconductor transit time negative resistance device, obtained according to an embodiment of the present invention, having a frequency-dependent negative resistance arising from a phase delay between the current waveform and voltage waveform due to the mixed phenomena of avalanche injection and tunnel injection and to the transit time effect caused by such phenomena.

A transit time negative resistance diode 4 in the present invention is mounted on a stem 2 which concurrently serves as a heat-sink. One conducting region of this diode 4 is electrically connected to said stem 2, and its another conducting region is electrically connected to a metal tape 5 made of, for example, gold. This metal tape 5, in turn, is connected, by means of a quartz plate having its both sides metallized, to a biasing post 6 which is intended to apply an external biasing voltage.

The stem 2 and the diode 4 supported thereon are housed in a rectangular waveguide 1 having the formation of a cavity resonator. As a matter of course, the biasing post 6 is electrically isolated from this rectangular waveguide 1. An input or biasing voltage is supplied from a power supply 8 to the biasing post 6 and to the rectangular wave guide 1. This power supply 8 is capable of being provided with DC, or pulse. A tuning short 7 is provided on one end of the cavity resonator of the rectangular waveguide 1 for adjusting the output power in one direction, and a rectangular waveguide 9 is connected to the other end thereof. The rectangular waveguide 9 is of such a structure that it is tapered or it has a progressively altering height to allow impedance transformation. The rectangular waveguide 9 is provided with an E-H tuner 10 for taking impedance matching with a load. Reference numeral 11 represents an isolator and numeral 12 represents an output terminal.

An embodiment of the transit time negative resistance device which is employed in the oscillator circuit system of the present invention, i.e. the diode which performs carrier injection by virtue of the avalanche injection plus the tunnel injection, is described below.

This diode is of the p+n+n−n+ type structure made of GaAs.

It is fabricated according to the liquid phase epitaxial growth of crystal relying on the temperature difference method under controlled vapor pressure which is described in the Japanese Patent Preliminary Publication No. Sho 56-112761 entitled "A Method of Manufacturing a Group III-V Semiconductor Device" filed by authors of the present application. Although this manufacturing method is not necessarily indispensable for the fabrication of the diode of the present invention, it is a method which is very effective in realizing the liquid phase epitaxial growth of crystal for producing a semiconductor device which uses two or more different kinds of elements such as Group III and Group V elements having different vapor presures relative to each other, and is a method which can provide a semiconductor device made of a crystal having a good quality with a minimized deviation from stoichiometry, and which, accordingly, has an excellent electrical characteristic and has a prolonged life time.

Figures 2A, 2B:
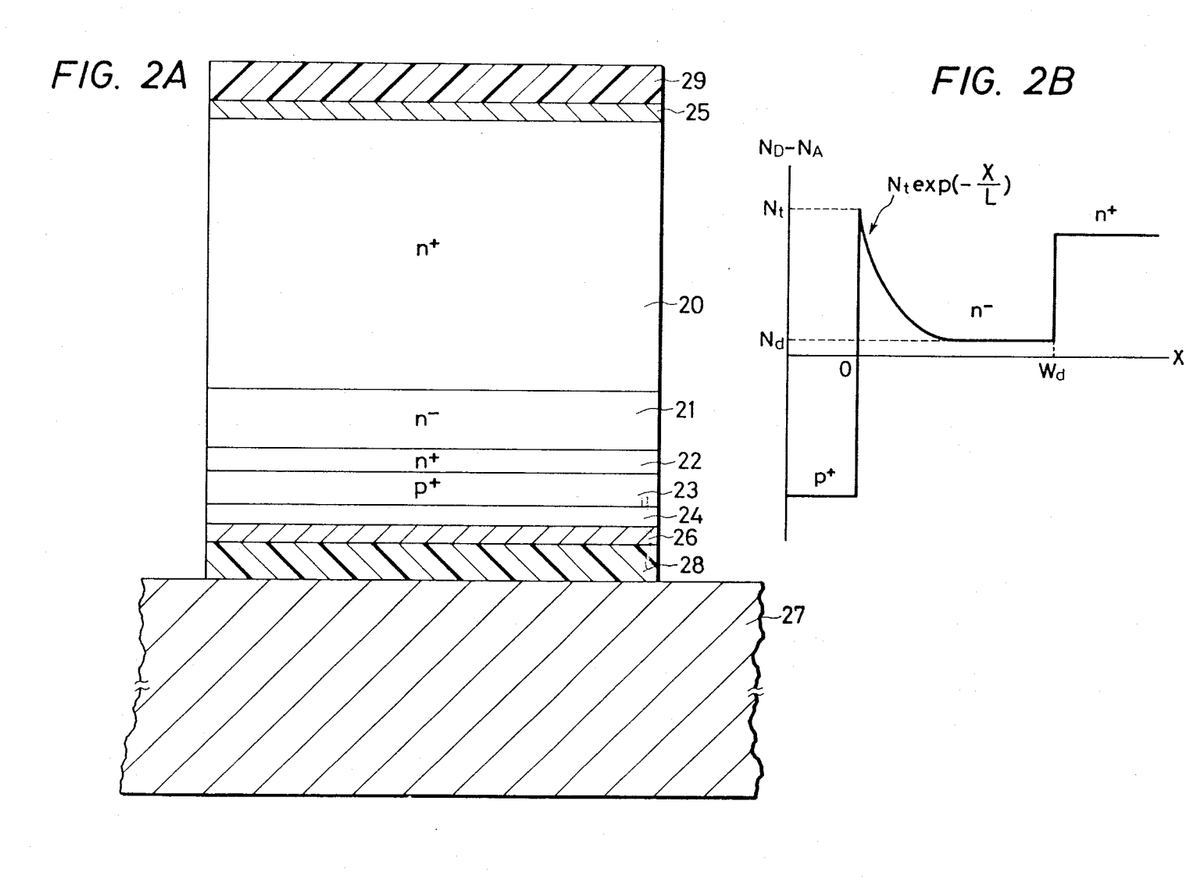
FIG. 2A is a diagrammatic sectional view of a structural example of the semiconductor transit time negative resistance diode employed in the present invention.
FIG. 2B is a diagrammatic representation showing the impurity distribution profile of the diode shown in FIG. 2A.

The GaAs p+n+n−n+ diode which represents this embodiment is illustrated of its cross sectional structure in FIG. 2A, and its internal impurity distribution profile is shown in FIG. 2B.

In FIG. 2A, reference numeral 20 represents a GaAs N+ type substrate ($\rho$: $10^{-3}$ $\Omega$·cm); 21, 22 and 23 represent an n− type layer, an n+ type layer and a p+ type layer, respectively, which have been grown in liquid phase by the abovesaid crystal growth method. Numeral 24 represents a Zn diffusion layer which is provided to minimize the value of the contact resistance when an ohmic contact is taken for the p+ layer 23. Numeral 25 represents an electrode for the n+ type layer 22, and this electrode is, for example, an Au-Ge alloy metal layer. Numeral 26 represents an electrode for the p+ type layer 23, and this electrode is either an Ag-Zn alloy metal layer or an Ag-Zn-Ag three-layer structure metal layer. Numeral 27 represents a heat-sink made of a copper or a diamond. Numerals 28 and 29 denote gold layers which are in contact with the p+ type electrode layer and the n+ type electrode, respectively. The contact between this heat-sink 27 and the gold layer 28 which serves as the electrode for the p+ type layer 23 is formed by relying on a thermal compression bonding or on a soldering using a metal solder having a low melting point.

The diode mentioned above has an impurity concentration distribution as schematically illustrated in FIG. 2B. The impurity concentration distribution in the n+ type layer 22 is such that it is high in the degree of concentration, being $N_t$, at a location where this layer 22 is in contact with the p+ type layer 23, and the concentration decreases gradually progressively as the location goes toward the n− type layer 21. The n+ type layer having such an impurity concentration distribution as mentioned above has been obtained by relying on the technique that, when the p+ type layer 23 is grown, sulphur atoms S which is an n type impurity is added simultaneously at the time of growth to Ge which is a p type impurity, in such a way that the amount of Ge is greater than the amount of S so as to produce a p+ type layer. It should be noted that, within the GaAs crystal, S (sulphur) which is an n type impurity has a greater diffusion coefficient as compared to the p type impurity Ge. Therefore, during the growth of said p+ type layer 23 in liquid phase growth which is conducted following the liquid phase epitaxial growth of the n− type layer 21, the n type impurity sulphur atoms undergo a thermal diffusion into the n− type layer, so that there is formed a thin n+ type layer 22 in which the impurity concentration exerts a gradual progressive change as described above. Between this n+ type layer 22 and the n− type layer 21, there exists no clear-cut boundary with respect to their impurity concentrations. However, the thickness of the n+ type layer 22 can be controlled by either the length of time of growth of the p+ type layer 23, or the length of holding time of the layer at a constant temperature subsequent to the growth of the p+ type layer 23.

It has been found as a result of experiments that a good result is obtained by setting the impurity concentration of the n− type layer contained within the transit time device which is employed in the present invention at $10^{15} \sim 5 \times 10^{17}$ cm$^{-3}$ and by setting the impurity concentration of the p+ type layer at $5 \times 10^{18}$ cm$^{-3}$ or higher. It has been found also that the distribution of the impurity concentration of the n+ type layer 22 can be well approximated generally by the below-mentioned Equation (1):

$$N(x) = N_t \exp(-X/L) + N_d \qquad (1)$$

Such an impurity concentration distribution of the pn junction is called generally "hyper abrupt junction". Here, $N_t$ represents a maximum donor concentration at the p+n+ junction, and L represents the degree of the impurity gradient, and denotes the so-called diffusion length of the impurity ($\equiv \sqrt{D\tau}$, wherein D represents a donor impurity diffusion constant, and $\tau$ represents a diffusion time), and $N_d$ represents the impurity concentration of the n− type layer 21.

It has been found that, in order to realize coexistence of the tunnel injection phenomenon and the carrier injection phenomenon which is caused by an avalanche breakdown, the maximum donor concentration $N_t$ need to be set at about $3 \times 10^{17}$ cm$^{-3}$ or higher and the impurity diffusion length L at about 50Å~about 300Å. A good result is obtained by setting the sum ($W_d$) of the thicknesses of the n+ type layer 22 and of the n− type layer 21 so as to insure that the phase delay angle ranges from about $\pi$ to $3/2\pi$ radian. In order to obtain an oscillation frequency of 100 GHz or greater, it is only necessary to set $W_d$ at about 1 $\mu$m or smaller. In such a diode as a p+n type diode or a Schottky barrier diode (metal-n type junction diode) having an abrupt junction, it is only necessary to set the value of the electric field intensity at the pn junction during its operation at about $10^6$ V/cm or greater. In the diode having a p+n junction, there jointly exist a tunnel injection of carriers and an injection of carriers due to avalanche breakdown when the impurity concentration of the n type region is $5 \times 10^{17}$ atoms/cm$^3$. When this impurity concentration thereof exceeds $5 \times 10^{17}$ atoms/cm$^3$, the tunnel injection becomes dominant. In case of a Schottky barrier diode, it is only necessary to set the impurity concentration of the n type region at about $3 \times 10^{17}$ atoms/cm$^3$ or higher. However, in order to avoid the degradation of the life time of the device due to an elevation of the junction temperature of the device, the employment of the pn junction diode is desirable as the transit time negative resistance diode in the present invention rather than the Schottky barrier diode.

Figure 3:
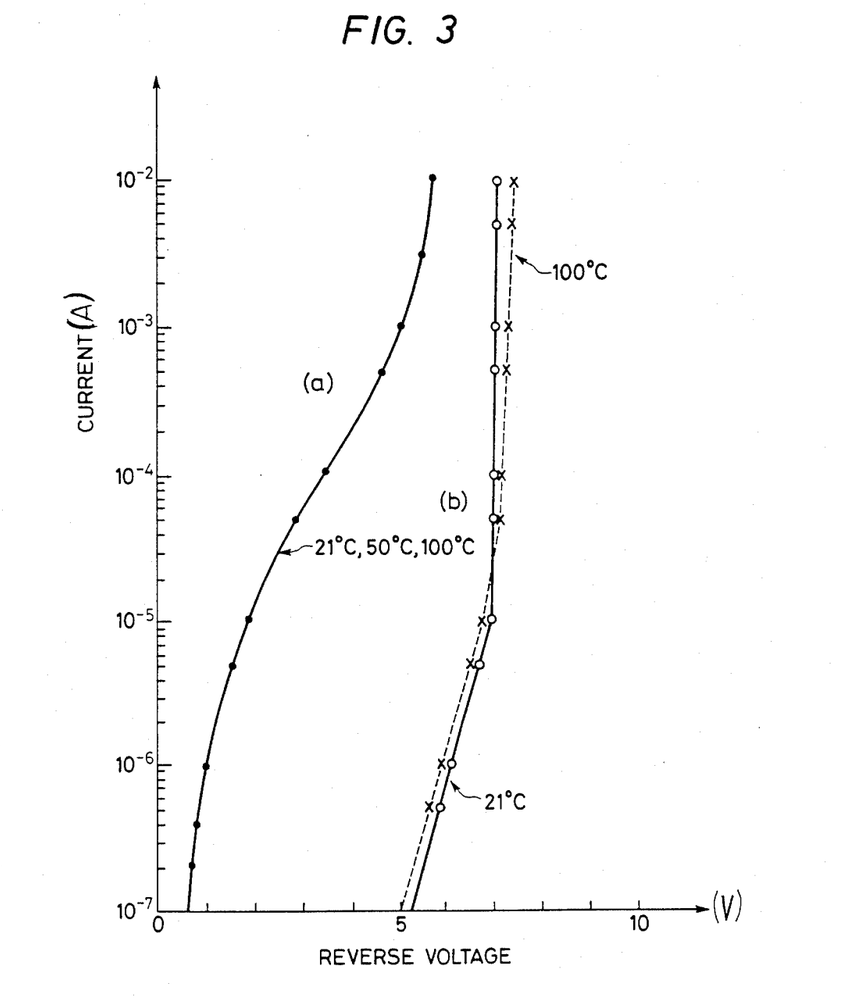
FIG. 3 is a chart showing an actually measured example of the reverse current-voltage characteristics of the semiconductor transit time negative resistance device employed in the present invention and also the measured example of its temperature dependence.

Some examples of the reverse current-voltage (I-V) characteristics which have been measured of the transit time negative resistance diodes having such impurity concentrations as shown in FIG. 2B while varying the device temperature between 21° C., 50° C. and 100° C. are shown in FIG. 3. In case of the diode (a), the value of the reverse current is noted to be constant, with the temperature coefficient thereof being 0, even when the device temperature is varied. In case of the diode (b), on the other hand, the temperature coefficient sign of the current is noted to differ between the small current region and the large current region, and the sign shifts from the negative to the positive. In this Figure, however, only the I-V characteristics of the diode (b) at the device temperatures of 21° C. and 100° C. are shown. It should be noted here that the reverse currents of the diode (a) and the diode (b) in these examples are caused by the co-existence of the avalanche injection and the tunnel injection.

Figure 4:
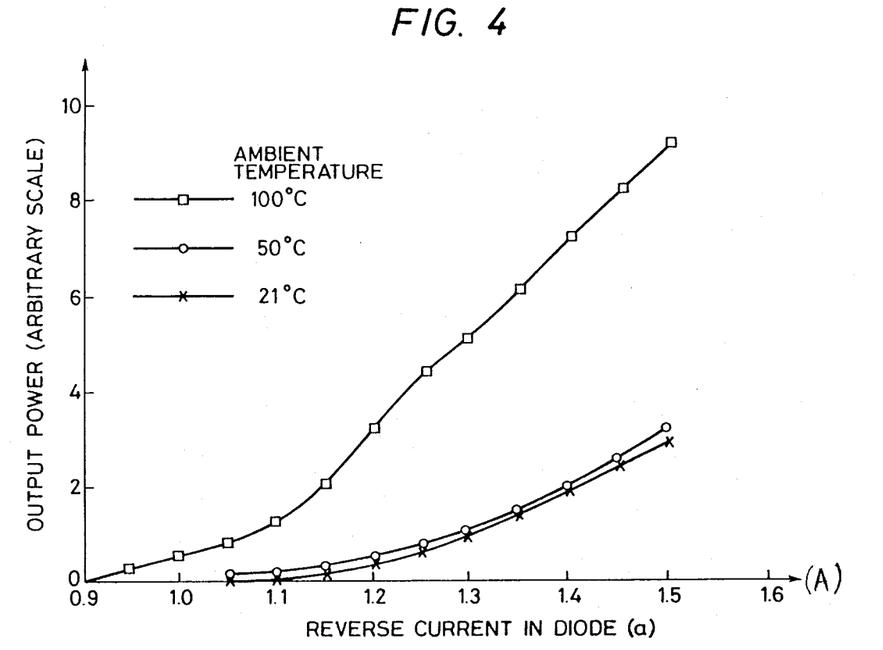
FIGS. 4 and 5 are charts showing examples of measurement of the relationship between the output power of the oscillator according to the present invention and the reverse current of the diode, using the diode temperature as the parameter of measurement.
Figure 5:
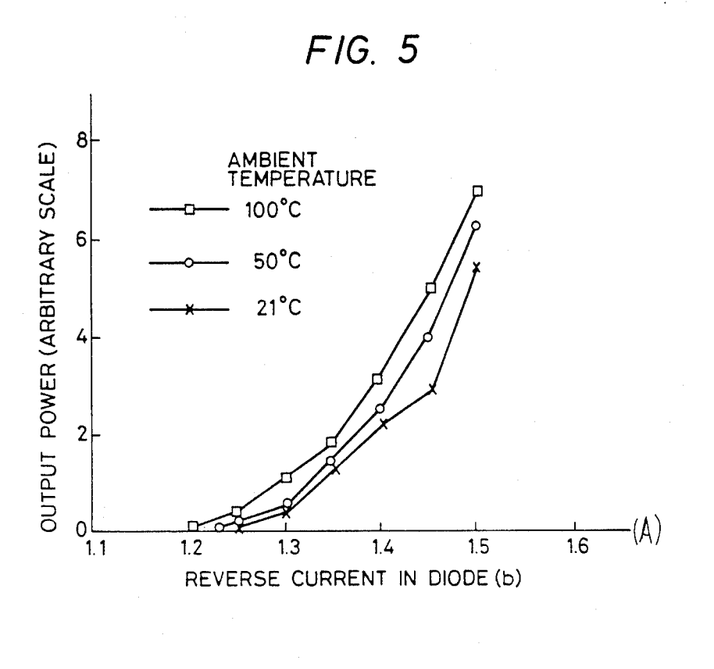

FIG. 4 shows the result of measurement of the relationship between the reverse current and the oscillation output power in the diode (a) of FIG. 3, conducted by varying the device temperature between 21° C., 50° C. and 100° C. FIG. 5 shows the similar measurement data in the diode (b) of FIG. 3. These results invariably show that the output power increases with a rise in the temperature and that the temperature coefficient for power output variation is noted to be positive, $dP/dT>0$, for each value of reverse current. The oscillation frequency of the diode (a) of FIG. 3 varies between about 127~135 GHz with change in the value of the biasing current, while that of the diode (b) of FIG. 3 shows a variation of the oscillation frequency between about 100~116 GHz. The reverse voltage applied to these diodes is in the range of about 5~9 V, being lower than 10 V.

There is easily obtained an output power of 20 mW of the oscillator at an oscillation frequency of about 120 GHz for the pulse operation at a duty ratio of 1%, and also, an output power of about 30 mW in the vicinity of 150 GHz. Also, the frequency spectrum is noted to be very stable and clear when viewed from the measurement of the standing wave in the waveguide circuit under test. The reason therefor is inferred to be due to the fact that, because the current caused by the tunnel injection considerably contributes to the oscillation, there is marked reduction in noise.

As stated above, in the IMPATT diode, because its production of big noise and its temperature coefficient for power output variation, $dP/dT$, being negative, this diode has a limitation in its oscillation frequency. In contrast thereto, the TUNNETT diode produces very little noise and has a positive temperature coefficient for power output variaton, $dP/dT$, and there has been obtained a very high oscillation frequency such as about 300 GHz or greater under pulse operation, as reported by Nishizawa et al (Nishizawa is the inventor of the TUNNETT diode and is one of the co-inventors of the present invention). In order to produce only the tunnel injection, however, there has been a technically difficult problem also such as the controlling of the impurity located in the vicinity of the pn junction. Therefore, during the course of conducting a research of a TUNNETT diode which can develop pure tunnel injection, it has been foun that there can be obtained, relatively easily, a device (diode) wherein the carrier injection is brought about not only by a pure tunnel injection alone but also by being partially mixed with an avalanche injection. Such a "mixed" type diode has been found to have the advantages and conveniences that not only the noise is minimized but also a large output can be realized under a high oscillation frequency such that the temperature coefficient for power output variation, $dP/dT$, is either "0" or greater. The reason for this $dP/dT$ being equal to zero or greater can be considered to be explained that since those electrons which have caused tunnel injection serve as the nuclei for the development of an avalanche phenomenon, the temperature-dependent characteristic of the tunnel current exerts a strong influence over $dP/dT$. And, whether or not the avalanche injection is coexisting with the tunnel injection may be judged, is a simplified evaluation is desired, by checking the temperature dependency of the I-V characteristic of the device. If the reverse current of the diode is caused completely by the tunnel injection alone, there will be noted a further elevation of the oscillation frequency. In case of CW oscillation also, a similar characteristic has been acquired. More particularly, the threshold current decreases to about ½ of that noted during the pulse oscillation condition, and the output has been noted to increase with a rise in the temperature.

In case of a simple-structure oscillator, there may be the instance wherein the fluctuation of the output power provides no problem. In case, however, the output power is used in such an operation as modulation or demodulation, it is desirable that the fluctuation of the output power due to variation temperature be minimized as much as possible. By an appropriate designing of the diode, there can be realized very little fluctuation of the output power. However, it has been found that, in the present invention, this can be made feasible by an appropriate designing of the circuit system.

Figure 6:
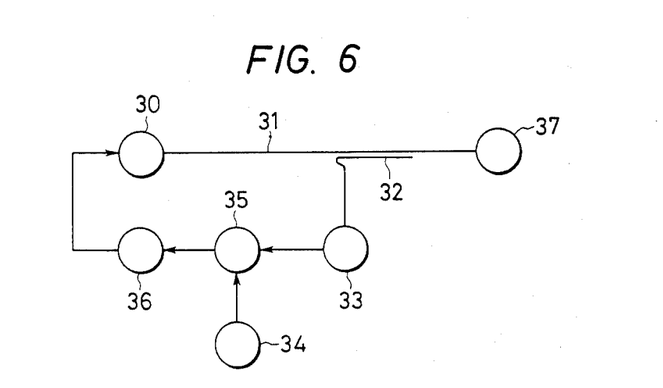
FIG. 6 is a block diagram showing an example of another embodiment of the circuit system of the extremely-high frequency oscillator using a semiconductor transit time negative resistance device according to the present invention, aimed to minimize the fluctuation of the output of the oscillator relative to the temperature thereof.

FIG. 6 shows a block diagram of an embodiment of the circuit system of an oscillator of the present invention which is capable of practically eliminating the fluctuation of output power due to variation of temperature. In FIG. 6, reference numeral 30 represents a cavity resonator on which is mounted such a diode as shown in FIG. 1; 31 a waveguide; 32 a directional coupler for deriving a part of the oscillation output from the resonator 30; 33 a monitor of the oscillation power, and for this purpose there is used a power meter or a diode detector. Numeral 34 represents a voltage supply for setting the level of the output delivered from the monitor 33; and 35 a circuit for comparing the output of the monitor 33 with the level-setting voltage and for controlling the feedback of the voltage which is applied from a power supply 36 to the resonator 30. In order to operate this circuit system, the first step is to preliminary check the relationship between the output power delivered from the monitor 33 and the oscillation output power from the resonator 30, and then the reference voltage supply 34 is set to a desired power level, to thereby electronically control the biasing voltage of the power supply 36 which is applied to the diode mounted on the resonator. The circuitry for effecting this control can be easily constructed by using a transistor, a diode, an integrated circuit or the like. By relying on such a technique as described above, it is possible to substantially eliminate the fluctuation of output power which is attributable to variation in temperature.

In the embodiment described above for explaining the present invention, a GaAs diode has been employed to serve as the transit time negative resistance diode. It should be understood that crystals of Group IV such as silicon, other Group III-V crystals, or Group II-VI crystals, or their mixed crystals may be used equally effectively. Also, the manufacturing method of the diode may rely on the well-known vapor phase epitaxial growth method, MOCVD method or ion implantation method, as will be needless to say. The diode and the cavity resonator of the circuit as well as other electrical parts may employ a planar circuit such a strip line or fin line, or a dielectric line such as Goubou line, in addition to the above-mentioned circuit system using the waveguide.

As has been described above, the extremely-high frequency negative resistance semiconductor oscillator according to the present invention is such that there can be easily realized one in which temperature coefficient for power output variation sign becomes 0 or positive and whose output is 10 mW or greater at the oscillation frequency of 100 GHz or more at the biasing voltage of about 10 V or lower, and in addition such an oscillator can be operated at normal temperature. Thus, the oscillator of the present invention has a very high industrial value.

What is claimed is:

1. An extremely-high frequency semiconductor oscillator comprising:
    a wavelength means forming a cavity resonator therein for producing an output wave;
    a semiconductor transit time device having a frequency-dependent negative resistance mounted in said cavity resonator;
    a power supply connected via a biasing post to said semiconductor device for applying a biasing voltage to said device and to said wave guide means; and
    a reflector connected to one end of said cavity resonator for orienting the output wave of said device in one direction, the improvement wherein:
    said semiconductor device has a $p^+n^+n^-n^+$ structure in which an impurity concentration distribution $N(x)$ in the $n+$ type layer between the $p+$ and $n-$ layers is expressed by $$N(x) = N_t \exp(X/L) + N_d$$

where $N_t$ represents a maximum donor concentration at the $p^+n^+$ junction, and L represents the degree of the impurity gradient, and $N_d$ represents the impurity concentration of the $n-$ type layer, and said device being comprised of a diode designed so that carrier injection is effected by combining an avalanche and a tunnel phenomena and the current-reverse-voltage characteristic has a temperature dependency which is constant with increase in device temperature or is varied to augment and subsequently to inhibit current flow with increase in device temperature whereby the output power of said oscillator has a temperature dependency which increases as the temperature rises.

2. An extremely-high frequency semiconductor oscillator according to claim 1, in which:
    said diode is fabricated with GaAs, and said diode is operated at a voltage of 10 V or lower.

3. An extremely-high frequency semiconductor oscillator according to claim 1, in which:
    said diode is fabricated with either a Group IV crystal, a Group III-V crystal, a Group II-IV crystal or a mixture comprising at least of said Group IV, Group III-V and Group II-VI crystals, and said diode is operated at a voltage of 10 V or lower.

4. An extremely-high frequency semiconductor oscillator according to claim 1, further comprising:
    means provided on output side of said oscillator for deriving a part of its oscillation output power; and
    circuit means for comparing the derived output power with a voltage level of a reference voltage supply for setting said biasing voltage to said reference voltage to thereby avoid fluctuation of the oscillation output power from the oscillator.

5. An extremely-high frequency semiconductor oscillator according to claim 4, in which:
    said means for deriving a part of its oscillation output power is a directional coupler.

6. An extremely high-frequency semiconductor oscillator according to claim 2, wherein
    an electrode for the other $n+$ type layer is formed of an Au-Ge alloy metal layer and an electrode for an $p+$ type layer is formed of an Ag-Zn-Ag metal layer in contact with an Au layer.

* * * * *

UNITED STATES PATENT AND TRADEMARK OFFICE
CERTIFICATE OF CORRECTION

PATENT NO. : 4,745,374
DATED : May 17, 1988
INVENTOR(S) : NISHIZAWA et al.

It is certified that error appears in the above-identified patent and that said Letters Patent is hereby corrected as shown below:

Col. 9, claim 1, line 17 thereof, change "n+" to -- $n^+$ -- and change "p+" to -- $p^+$ --;

line 18, change "n-" to -- $n^-$ --;

Col. 10, claim 1, line 23, change "n-" to -- $n^-$ --.

claim 3, line 4, change "Group II-IV" to -- Group II-VI.

claim 6, line 5, change "p+" to -- $p^+$ --.

Signed and Sealed this

Twenty-second Day of October, 1991

*Attest:*

HARRY F. MANBECK, JR.

*Attesting Officer*         *Commissioner of Patents and Trademarks*